United States Patent
Cox et al.

(10) Patent No.: US 7,288,421 B2
(45) Date of Patent: Oct. 30, 2007

(54) METHOD FOR FORMING AN OPTOELECTRONIC DEVICE HAVING AN ISOLATION LAYER

(75) Inventors: James Allen Cox, New Brighton, MN (US); Robert A. Morgan, Plymouth, MN (US)

(73) Assignee: Finisar Corporation, Sunnyvale, CA (US)

( * ) Notice: Subject to any disclaimer, the term of this patent is extended or adjusted under 35 U.S.C. 154(b) by 205 days.

(21) Appl. No.: 10/884,895

(22) Filed: Jul. 6, 2004

(65) Prior Publication Data

US 2004/0248331 A1    Dec. 9, 2004

Related U.S. Application Data

(62) Division of application No. 09/751,422, filed on Dec. 29, 2000, now Pat. No. 6,782,027.

(51) Int. Cl.
*H01L 21/00* (2006.01)
(52) U.S. Cl. ............................. 438/29; 438/31; 438/32
(58) Field of Classification Search .................. 438/22, 438/29, 31, 32, 34–40, 46–47
See application file for complete search history.

(56) References Cited

U.S. PATENT DOCUMENTS

| | | | |
|---|---|---|---|
| 4,317,085 A | 2/1982 | Brunham et al. ............. | 372/50 |
| 4,466,694 A | 8/1984 | MacDonald .................. | 385/37 |
| 4,660,207 A | 4/1987 | Svilans ....................... | 372/45 |
| 4,784,722 A | 11/1988 | Liau et al. ................... | 156/649 |
| 4,885,592 A | 12/1989 | Kofol et al. ................. | 343/753 |
| 4,901,327 A | 2/1990 | Bradley ....................... | 372/45 |
| 4,943,970 A | 7/1990 | Bradley ....................... | 372/45 |
| 4,956,844 A | 9/1990 | Goodhue et al. ............. | 372/44 |
| 5,031,187 A | 7/1991 | Orenstein et al. ............. | 372/50 |
| 5,034,958 A | 7/1991 | Kwon et al. | |
| 5,052,016 A | 9/1991 | Mahbobzadeh et al. ...... | 372/96 |
| 5,056,098 A | 10/1991 | Anthony et al. .............. | 372/45 |

(Continued)

FOREIGN PATENT DOCUMENTS

DE    4 240 706 A    6/1994

(Continued)

OTHER PUBLICATIONS

Schubert, et al., "Resonant Cavity Light-emitting Diode," *Appl. Phys. Lett.*, vol. 60, No. 8, Feb. 24, 1992, pp. 921-923.

(Continued)

*Primary Examiner*—Thanhha S. Pham
(74) *Attorney, Agent, or Firm*—Workman Nydegger

(57) ABSTRACT

Methods are disclosed for forming optoelectronic devices. In one example of such a method, a substrate is provided and a partially conductive bottom mirror formed thereon. An active region is then formed on the bottom mirror, and a top mirror formed on the active region. A gain guide is then formed in the top mirror. Finally, a substantially dielectric isolation layer, as well as a resonant reflector, are formed on the top mirror. The isolation layer is interposed between the resonant reflector and the top mirror, and the isolation layer is formed so as to substantially prevent energy in an evanescent tail of a guided mode associated with the resonant reflector from entering the top mirror.

16 Claims, 13 Drawing Sheets

U.S. PATENT DOCUMENTS

| | | | |
|---|---|---|---|
| 5,062,115 A | 10/1991 | Thornton | 372/50 |
| 5,068,869 A | 11/1991 | Wang et al. | 372/45 |
| 5,115,442 A | 5/1992 | Lee et al. | 372/45 |
| 5,140,605 A | 8/1992 | Paoli et al. | 372/50 |
| 5,158,908 A | 10/1992 | Blonder et al. | 437/129 |
| 5,216,263 A | 6/1993 | Paoli | 257/88 |
| 5,216,680 A | 6/1993 | Magnusson et al. | 372/20 |
| 5,237,581 A | 8/1993 | Asada et al. | 372/45 |
| 5,245,622 A | 9/1993 | Jewell et al. | 372/45 |
| 5,258,990 A | 11/1993 | Olbright et al. | 372/46 |
| 5,285,466 A | 2/1994 | Tabatabaie | 372/92 |
| 5,293,392 A | 3/1994 | Shieh et al. | 372/45 |
| 5,317,170 A | 5/1994 | Paoli | 257/88 |
| 5,317,587 A | 5/1994 | Ackley et al. | 372/45 |
| 5,325,386 A | 6/1994 | Jewell et al. | 372/50 |
| 5,331,654 A | 7/1994 | Jewell et al. | 372/45 |
| 5,337,074 A | 8/1994 | Thornton | 346/107 R |
| 5,349,599 A | 9/1994 | Larkins | 372/50 |
| 5,351,256 A | 9/1994 | Schneider et al. | 372/45 |
| 5,359,447 A | 10/1994 | Hahn et al. | 359/154 |
| 5,359,618 A | 10/1994 | Lebby et al. | 372/45 |
| 5,363,397 A | 11/1994 | Collins et al. | 372/92 |
| 5,373,520 A | 12/1994 | Shoji et al. | 372/45 |
| 5,404,373 A | 4/1995 | Cheng | 372/50 |
| 5,416,044 A | 5/1995 | Chino et al. | 437/129 |
| 5,428,634 A | 6/1995 | Bryan et al. | 372/45 |
| 5,446,754 A | 8/1995 | Jewell et al. | 372/50 |
| 5,475,701 A | 12/1995 | Hibbs-Brenner | 372/50 |
| 5,513,202 A | 4/1996 | Kobayashi et al. | 372/96 |
| 5,530,715 A | 6/1996 | Shieh et al. | 372/96 |
| 5,555,255 A | 9/1996 | Kock et al. | 372/96 |
| 5,557,626 A | 9/1996 | Grodzinski et al. | 372/45 |
| 5,561,683 A | 10/1996 | Kwon | 372/96 |
| 5,568,499 A | 10/1996 | Lear | 372/45 |
| 5,598,300 A | 1/1997 | Magnusson et al. | 359/566 |
| 5,606,572 A | 2/1997 | Swirhun et al. | 372/96 |
| 5,642,376 A | 6/1997 | Olbright et al. | 372/45 |
| 5,727,013 A | 3/1998 | Botez et al. | 372/96 |
| 5,774,487 A | 6/1998 | Morgan | 372/45 |
| 5,778,018 A | 7/1998 | Yoshikawa et al. | 372/45 |
| 5,818,066 A | 10/1998 | Duboz | 257/21 |
| 5,903,590 A | 5/1999 | Hadley et al. | 372/96 |
| 5,940,422 A | 8/1999 | Johnson | 372/45 |
| 5,978,401 A | 11/1999 | Morgan | 372/50 |
| 6,055,262 A | 4/2000 | Cox et al. | 372/96 |
| 6,636,678 B1 * | 10/2003 | Bendett et al. | 385/132 |

FOREIGN PATENT DOCUMENTS

| | | |
|---|---|---|
| EP | 0 776 076 A | 5/1997 |
| EP | 0 288 184 A | 10/1998 |
| JP | 60-123084 A | 7/1985 |
| JP | 02-054981 A | 2/1990 |
| JP | 5-299779 | 11/1993 |
| WO | WO91/16748 | 10/1991 |
| WO | WO96/42026 | 12/1996 |
| WO | WO99/31735 | 6/1999 |

OTHER PUBLICATIONS

Morgan, et al., "Spatial-Filtered Vertical-Cavity Top Surface-Emitting Lasers," CLOE '93, Conference on Lasers and Electro-Optics, 1993, pp. 138-139.

Morgan, et al., "Novel Hybrid-DBR Single-Mode Controlled GaAs Top-Emitting VCSEL with Record Low Voltage," dated prior to Dec. 29, 2000, 2 pages.

Nugent, et al., "Self-pulsations in Vertical-Cavity Surface-Emitting Lasers," *Elec. Lett.*, vol. 31, No. 1, Jan. 5, 1995, pp. 43-44.

Guenter, et al., "Reliability of Proton-Implanted VCSELs for Data Communications," Invited Paper, *SPIE*, vol. 2683, OE LASE 96; Photonics West: Fabrication, Testing and Reliability of Semiconductor Laser, (SPIE, Bellingham, WA 1996), pp. 102-113.

Hibbs-Brenner, et al., "Performance, Uniformity and Yield of 850nm VCELs Deposited by MOVPE," *IEEE Phot. Tech. Lett.*, vol. 8, No. 1, Jan. 1996, pp. 7-9.

Hornak, et al., "Low-Temperature (10K-300K) Characterization of MOVPE-Grown Vertical-Cavity Surface-Emitting Lasers," *Phot. Tech. Lett.*, vol. 7, No. 10, Oct. 1995, pp. 1110-1112.

Huffaker, et al., "Lasing Characteristics of Low Threshold Microcavity Layers Using Half-Wave Spacer Layers and Lateral Index Confinement," *Appl. Phys. Lett.*, vol. 66, No. 14, Apr. 3, 1995, pp. 1723-1725.

K.L. Lear, et al., "Selectively Oxidized Vertical Cavity Surface-Emitting Lasers with 50% Power Conversion Efficiency," *Elec. Lett.*, vol. 31, No. 3, Feb. 2, 1995, pp. 208-209.

Lehman, et al., "High Frequency Modulation Characteristics of Hybrid Dielectric/AlGaAs Mirror Singlemode VCSELs," *Elec. Lett.*, vol. 31, No. 15, Jul. 20, 1995, pp. 1251-1252.

Magnusson, "Integration of Guided-Mode Resonance Filters and VCSELs," Electo-Optics Research Center, Department of Electrical Engineering, University of Texas at Arlington, May 6, 1997.

Morgan, et al., "One Watt Vertical Cavity Surface Emitting Lasers," *Elec. Lett.*, vol. 29, No. 2, Jan. 21, 1993, pp. 206-207.

Morgan, et al., "Producible GaAs-based MOVPE-Grown Vertical-Cavity Top-Surface Emitting Lasers with Record Performance," *Elec. Lett.*, vol. 31, No. 6, Mar. 16, 1995, pp. 462-464.

Wang, et al., "Multilayer Waveguide-Grating Filters," *Appl. Opt.*, vol. 34, No. 14, pp. 2414-2420, 1995.

Wang, et al., "Theory and Applications of Guided-Mode Resonance Filters," *Appl. Opt.*, vol. 32, No. 14, 1993, pp. 2606-2613.

Schubert, "Resonant Cavity Light-Emitting Diode," *Appl. Phys. Lett.*, vol. 60, No. 8, Feb. 24, 1992, pp. 921-923.

Yang, et al., Ultralow Threshold Current Vertical Cavity Surface Emitting Lasers Obtained with Selective Oxidation, *Elect. Lett.*, vol. 31, No. 11, Macy 25, 1995, pp. 886-888.

Yablonovitch, et al., "Photonic Bandgap Structures," *J. Opt. Soc. Am. B.*, vol. 10, No. 2, Feb. 1993, pp. 283-295.

Young, et al., "Enhanced Performance of Offset-Gain High Barrier Vertical-Cavity Surface-Emitting Laser," *IEEE J. Quantum Electron*, vol. 29, No. 6, Jun. 1993, pp. 2013-2022.

Smith, et al., Polarization-Sensitive Subwavelength Antireflection Surfaces on a Semiconductor for 975 NM, *Optics Letters*, vol. 21, No. 15, Aug. 1, 1996, pp. 1201-1203.

Tang, et al., "Design Limitations of Highly Parallel Free-Space Optical Interconnects Based on Arrays of Vertical Cavity Surface-Emitting Laser Diodes, Microlenses and Photodetectors," Journal of Lightwave Technology, vol. 12, No. 11, Nov. 1, 1994, pp. 1971-1975.

Cox, et al., "Guided Mode Grating Resonant Filters for VCSEL Applications," *Proceedings of the SPIE*, The International Society for Optical Engineering, Diffractive and Holographic Device Technologies and Applications V, San Jose, California, Jan. 28-29, 1998, vol. 3291, pp. 70-71.

Martinsson, et al., "Transverse Mode Selection in Large-Area Oxide-Confined Vertical-Cavity Surface-Emitting Lasers Using a Shallow Surface Relief," *IEEE Photon. Technol. Lett.*, 11(12), 1999, pp. 1536-1538.

Choquette, et al., "Lithographically-Defined Gain Apertures Within Selectively Oxidized VCSELs," paper CtuL6, Conference on Lasers and Electro-Optics, San Francisco, California, 2000.

Oh, et al., "Single-Mode Operation in Antiguided Vertical-Cavity Surface-Emitting Laser Using a Low-Temperature Grown AlGaAs Dielectric Aperture," *IEEE Photon. Technol. Lett.*, 10(8), 1998, pp. 1064-1066.

Jwell et al, Surface-Emitting Microlasers for Photonic Switching and Interchip Connections, *Optical Engineering*, Mar. 29, 1990, pp. 210-214.

Shtengel, et al., "High-Speed Vertical-Cavity Surface-Emitting Lasers," *Photon. Tech. Lett.*, vol. 5, No. 12, Dec. 1993, pp. 1359-1361.

Banwell, et al., "VCSE Laser Transmitters for Parallel Data Links," *IEEE Journal of Quantum Electronics*, vol. 29, No. 2, Feb. 1993, pp. 635-644.

Catchmark, et al., "High Temperature CW Operation of Vertical Cavity Top Surface-Emitting Lasers," CLEO 1993, p. 138-140.

Chemla, et al., "Nonlinear Optical Properties of Semiconductor Quantum Wells," *Optical Nonlinearities and Instabillties in Semiconductors,* Academic Press, Inc., Copyright 1988, pp. 83-120.

Choa, et al., "High-Speed Modulation of Vertical-Cavity Surface-Emitting Lasers," *IEEE Photonics Technology Letter,* vol. 3, No. 8, Aug. 1991, pp. 697-699.

G.G. Ortiz, et al., "Monolithic Integration of In0.2 GA0.8 As Vertical Cavity Surface-Emitting Lasers with Resonance-Enhanced Quantum Well Photodectors," *Elec. Lett.,* vol. 32, No. 13, Jun. 20, 1996, pp. 1205-1207.

Graf, *Modern Dictionary of Electronics,* 6th ed., Indiana: Howard W. Sams & Company, 1984, p. 694.

Jewell, et al., "Surface Emitting Microlasers for Photonic Switching & Intership Connections," *Optical Engineering,* vol. 29, No. 3, Mar. 1990, pp. 210-214.

Kishino, et al., "Resonant Cavity-Enhanced (RCE) Photodetectors," *IEEE Journal of Quantum Electronics,* vol. 27, No. 8, pp. 2025-2034, 1991.

Kuchibhotla, et al., "Low-Voltage High Gain Resonant Cavity Avalanche Photodiode," *IEEE Photon. Technol. Lett.,* vol. 3, No. 4, pp. 354-356, 1991.

Lai, et al., "Design of Tunable GaAs/AlGaAs Multiple-Quantum-Well Resonant Cavity Photodetector," *IEEE Journal of Qunatum Electronics,* vol. 30, No. 1, pp. 108-114, 1994.

Lee, et al., "Top-Surface Emitting GaAs Four-Quantum-Well Lasers Emitting at 0-85 um," *Elec. Lett.,* vol. 24, No. 11, May 24, 1990, pp. 710-711.

Miller, et al., "Optical Bistability Due to Increasing Absorption," *Optics Letters,* vol. 9, No. 5, May 1984, pp. 162-164.

Morgan, et al., "200 C, 96-nm Wavelength Range, Continuous-Wave Lasing from Unbonded GaAs MOVPE-Grown Vertical Cavity Surface-Emitting Lasers," *IEEE Photon. Technol. Lett.,* vol. 7, No. 5, May 1995, proprietary protocols. 441-443.

Jiang, et al., "High Frequency Polarization Self-Modulation in Vertical-Cavity Surface-Emitting Lasers," *Appl. Phys. Lett.,* vol. 63, No. 26, Dec. 27, 1993, pp. 2545-2547.

Morgan, et al., "High-Power Coherently Coupled 8x8 Vertical Cavity Surface Emitting Laser Array," *Appl. Phys. Lett.,* vol. 61, No. 10, Sep. 7, 1992, pp. 1160-1162.

Morgan, et al., "Hybrid Dielectric/AlGaAs Mirror Spatially Filtered Vertical Cavity Top-Surface Emitting Laser," *Appl Phys. Lett.,* vol. 66, No. 10, Mar. 6, 1995, pp. 1157-1159.

Morgan, et al., "Progress and Properties of High-Power Coherent Vertical Cavity Surface Emitting Laser Arrays," *SPIE,* Vo. 1850, Jan. 1993, pp. 100-108.

Morgan, et al., "Progress in Planarized Vertical Cavity Surface Emitting Laser Devices and Arrays," *SPIE,* vol. 1562, Jul. 1991, pp. 149-159.

Morgan, et al., "Submilliamp, Low-Resistance, Continuous-Wave, Single-Mode GaAs Planar Vertical-Cavity Surface Emitting Lasers," Honeywell Technology Center, Jun. 6, 1995.

Morgan, et al., "Transverse Mode Control of Vertical-Cavity Top-Surface Emitting Lasers," *IEEE Photon. Technol. Lett.,* vol. 4, No. 4, Apr. 1993, pp. 374-377.

Morgan, et al., "Vertical Cavity Surface Emitting Laser Arrays: Come of Age," Invited paper, *SPIE,* vol. 2683-04, OE LASE 96; Photonics West: Fabrication, Testing and Reliability of Semiconductor Lasers, (SPIE<Bellingham, WA 1996).

Morgan, et al., "Vertical-Cavity Surface-Emitting Laser Arrays," *SPIE,* vol. 2398, Feb. 1995, pp. 65-93.

Morgan, "High-Performance, Producible Vertical Cavity Lasers for Optical Interconnects," *High Speed Electronics and Systems,* vol. 5, No. 4, Dec. 1994, pp. 65-95.

U.S. Appl. No. 09/751,423, filed Dec. 29, 2000, entitled "Spatially Modulated Reflector for an Optoelectronic Device."

PCT International Search Report on PCT/US 01/49089, the PCT counterpart of the U.S. Patent Application, dated Oct. 1, 2002.

* cited by examiner

METHOD FOR FORMING AN OPTOELECTRONIC DEVICE HAVING AN ISOLATION LAYER

RELATED APPLICATIONS

This application is a divisional, and claims the benefit, of U.S. patent application Ser. No. 09/751,422, entitled RESONANT REFLECTOR FOR USE WITH OPTOELECTRONIC DEVICES, filed Dec. 29, 2000 now U.S. Pat. No. 6,782,027, and incorporated herein in its entirety by this reference.

BACKGROUND OF THE INVENTION

This invention relates to the field of optoelectronic devices, and more particularly to resonant reflectors for use with optoelectronic devices.

Various forms of optoelectronic devices have been developed and have found widespread use including, for example, semiconductor photodiodes, semiconductor photo detectors, etc. Semiconductor lasers have found widespread use in modern technology as the light source of choice for various devices, e.g., communication systems, compact disc players, and so on. For many of these applications, a semiconductor laser is coupled to a semiconductor detector (e.g., photodiode) through a fiber optic link or even free space. This configuration provides a high-speed communication path, which, for many applications, can be extremely beneficial.

A typical edge-emitting semiconductor laser is a double heterostructure with a narrow bandgap, high refractive index layer surrounded on opposed major surfaces by wide bandgap, low refractive index layers often called cladding layers. The low bandgap layer is termed the "active layer", and the cladding layers serve to confine both charge carriers and optical energy in the active layer or region. Opposite ends of the active layer have mirror facets which form the laser cavity. When current is passed through the structure, electrons and holes combine in the active layer to generate light.

Another type of semiconductor laser is a surface emitting laser. Several types of surface emitting lasers have been developed including Vertical Cavity Surface Emitting Lasers (VCSEL). (See, for example, "Surface-emitting microlasers for photonic switching and interchip connections", *Optical Engineering*, 29, pp. 210-214, March 1990, for a description of this laser). For other examples, note U.S. Pat. No. 5,115,442, by Yong H. Lee et al., issued May 19, 1992, and entitled "Top-emitting Surface Emitting Laser Structures", which is hereby incorporated by reference, and U.S. Pat. No. 5,475,701, issued on Dec. 12, 1995 to Mary K. Hibbs-Brenner, and entitled "Integrated Laser Power Monitor", which is hereby incorporated by reference. Also, see "Top-surface-emitting GaAs four-quantum-well lasers emitting at 0.85 µm", *Electronics Letters*, 26, pp. 710-711, May 24, 1990.)

Vertical Cavity Surface Emitting Lasers offer numerous performance and potential producibility advantages over conventional edge emitting lasers. These include many benefits associated with their geometry, including their amenability to one- and two-dimensional arrays, wafer-level qualification, and desirable beam characteristics, typically circularly symmetric low-divergence beams.

VCSELs typically have an active region having bulk or one or more quantum well layers. On opposite sides of the active region are mirror stacks, often formed by interleaved semiconductor layers each a quarter wavelength thick at the desired operating wavelength (in the medium). The mirror stacks are typically of opposite conductivity type on either side of the active region, and the laser is typically turned on and off by varying the current through the mirror stacks and the active region.

High-yield, high performance VCSELs have been demonstrated and exploited in commercialization. Top-surface-emitting AlGaAs-based VCSELs are producible in a manner analogous to semiconductor integrated circuits, and are amenable to low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields. VCSELs are expected to provide a performance and cost advantage in fast (e.g., Gbits/s) medium distance (e.g., up to approximately 1000 meters) single or multi-channel data link applications, and numerous optical and/or imaging applications. This results from their inherent geometry, which provides potential low-cost high performance transmitters with flexible and desirable characteristics.

A related photodetector is known as a resonant cavity photo detector (RCPD). Resonant cavity photodetectors are typically constructed similar to VCSELs, but operate in a reverse bias mode. A resonant cavity photodetector may be more efficient than a standard photodiode because the light that enters the optical cavity, through one of the mirrors, may be effectively reflected through the active region many times. The light may thus be reflected between the mirror stacks until the light is either absorbed by the active region or until it escapes through one of the mirror stacks. Because the mirror stacks are typically highly reflective near resonance, most of the light that enters the cavity is absorbed by the active region.

For many optoelectronic devices that have a resonant cavity, the top and/or bottom mirror stacks are Distributed Bragg Reflector (DBR) mirrors. DBR mirrors typically include a number of alternating layers of semiconductor material such as AlGaAs and AlAs. Often, both the top and bottom mirror stacks include a significant number of DBR mirror periods to achieve the desired reflectance. One way to reduce the number of DBR mirror periods that are required is to replace some of the DBR mirror periods with a resonant reflector. Such a configuration is disclosed in U.S. patent application Ser. No. 08/872,534, entitled "Resonant Reflector For Improved Optoelectronic Device Performance And Enhanced Applicability", which is incorporated herein by reference. A typical resonant reflector may include, among other things, a waveguide and a grating.

Despite the advantages of using a resonant reflector in conjunction with a DBR mirror stack, it has been found that the reflectivity of the resonant reflector can be limited if it is not properly isolated from adjacent conductive layers. Too much energy in the guided-mode in the waveguide overlaps into the lossy, conductive DBR films of the optoelectronic device. What would be desirable, therefore, is an optoelectronic device that provides isolation between the resonant reflector and adjacent conducting layers of the optoelectronic device.

BRIEF SUMMARY OF AN EXEMPLARY EMBODIMENT OF THE INVENTION

In general, exemplary embodiments of the invention are concerned with methods for forming optoelectronic devices. In one example of such a method, a substrate is provided and a partially conductive bottom mirror formed thereon. An active region is then formed on the bottom mirror, and a top mirror formed on the active region. A gain guide is then formed in the top mirror. Finally, a substantially dielectric isolation layer, as well as a resonant reflector, are formed on the top mirror. In this implementation, the resonant reflector includes waveguide and a grating. The isolation layer, which may be implemented as a substantially dielectric cladding or buffer layer, is interposed between the resonant reflector and the top mirror. Moreover, the isolation layer is formed so as to substantially prevent energy in an evanescent tail of a guided mode associated with the resonant reflector from entering the top mirror.

By constructing the device in this way, the resonant reflector is isolated from adjacent conductive layers, thus permitting the resonant reflector to achieve a relatively higher degree of reflectivity than would otherwise be the case. Specifically, isolation of the resonant reflector substantially limits, if not prevents, energy in the guided mode in the waveguide from overlapping into adjacent conductive films of an optoelectronic device.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
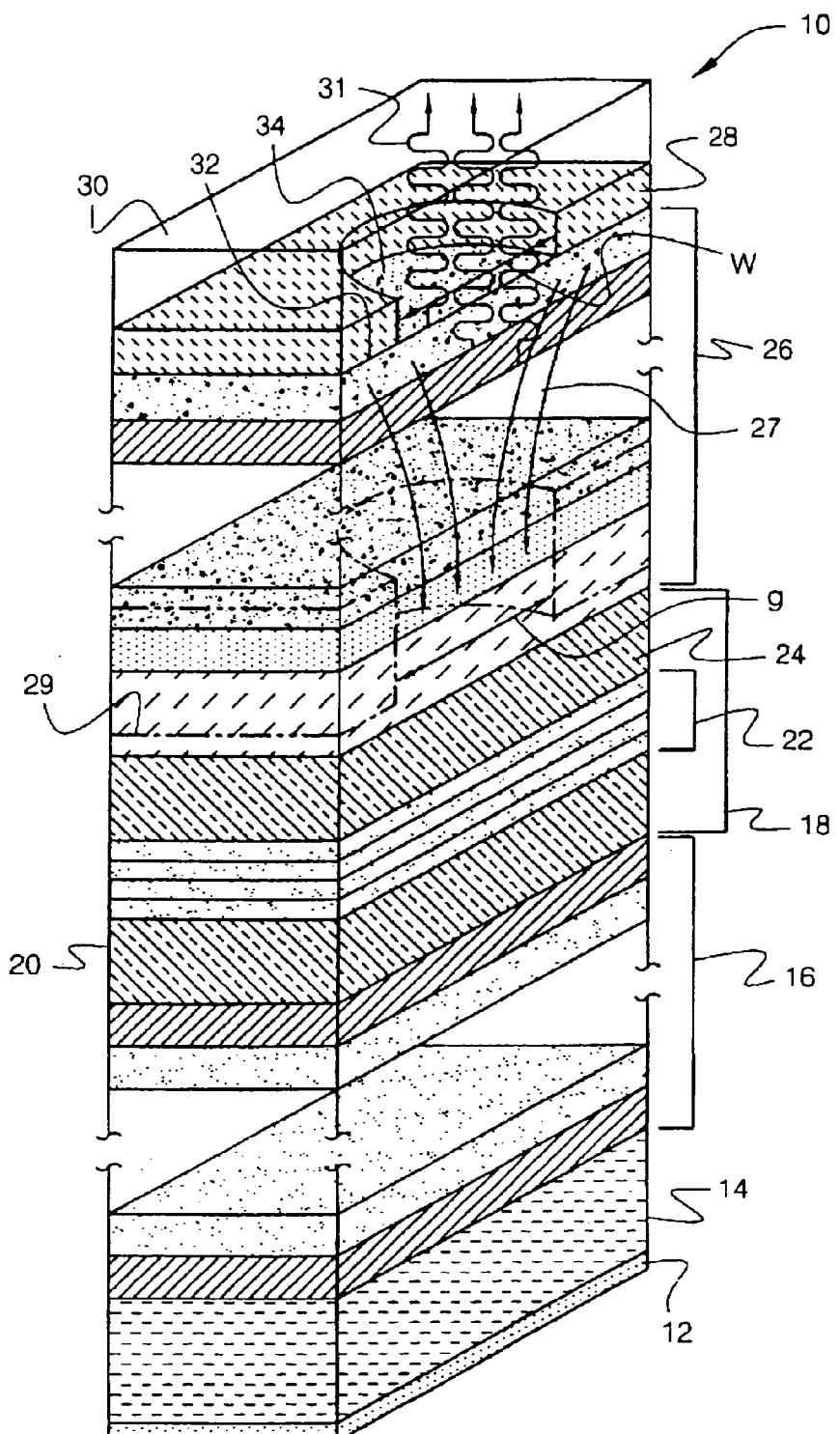
FIG. 1 is a schematic diagram of a planar, current-guided, GaAs/AlGaAs top surface emitting vertical cavity laser in accordance with the prior art.

FIG. 1 is a schematic illustration of a planar, current-guided, GaAs/AlGaAs top surface emitting vertical cavity laser 10 in accordance with the prior art. Formed on an n-doped gallium arsenide (GaAs) substrate 14 is a n-contact 12. Substrate 14 is doped with impurities of a first type (i.e., n type). An n-type mirror stack 16 is formed on substrate 14. Formed on stack 16 is a spacer 18. Spacer 18 has a bottom confinement layer 20 and a top confinement layer 24 surrounding active region 22. A p-type mirror stack 26 is formed on top confinement layer 24. A p-metal layer 28 is formed on stack 26. The emission region may have a passivation layer 30.

Isolation region 29 restricts the area of the current flow 27 through the active region. Region 29 may be formed by deep H+ ion implantation. While a deep H+ implant is provided as an illustration, it is contemplated that any type of current and field confinement may be used, including for example, gain-guided, oxide-confinement, or any other means. The diameter "g" may be set to provide the desired active area, and thus the gain aperture of the VCSEL 10. Further, the diameter "g" may be set by the desired resistance of the p-type mirror stack 26, particularly through the non-conductive region 29. Thus, non-conductive region 29 performs the gain guiding function. The diameter "g" is typically limited by fabrication limitations, such as lateral straggle during the implantation step.

Spacer 18 may contain a bulk or quantum-well active region disposed between mirror stacks 16 and 26. Quantum-well active region 22 may have alternating layers of aluminum gallium arsenide (AlGaAs) barrier layers and GaAs quantum-well layers. InGaAs quantum wells may also be used in the active region, particularly where an emission wavelength (e.g., λ=980 nm) is desired where GaAs is transparent. Stacks 16 and 26 are distributed Bragg reflector (DBR) stacks, and may include periodic layers of doped AlGaAs and aluminum arsenide (AlAs). The AlGaAs of stack 16 is doped with the same type of impurity as substrate 14 (e.g., n type), and the AlGaAs of stack 26 is doped with the other kind of impurity (e.g., p type).

Metal contact layers 12 and 28 are ohmic contacts that allow appropriate electrical biasing of laser diode 10. When laser diode 10 is forward biased with a more positive voltage on contact 28 than on contact 12, active region 22 emits light 31 which passes through stack 26.

A typical near IR VCSEL requires high reflectivity (>99%). Thus, an all-semiconductor DBR typically requires 20-40 mirror periods with a thickness of 2-4 μm. As such, the epi-structure required for a complete VCSEL, including both top and bottom DBR mirrors surrounding an active spacer region typically includes over 200 layers having a thickness in excess of 7-8 μm.

Figure 2:
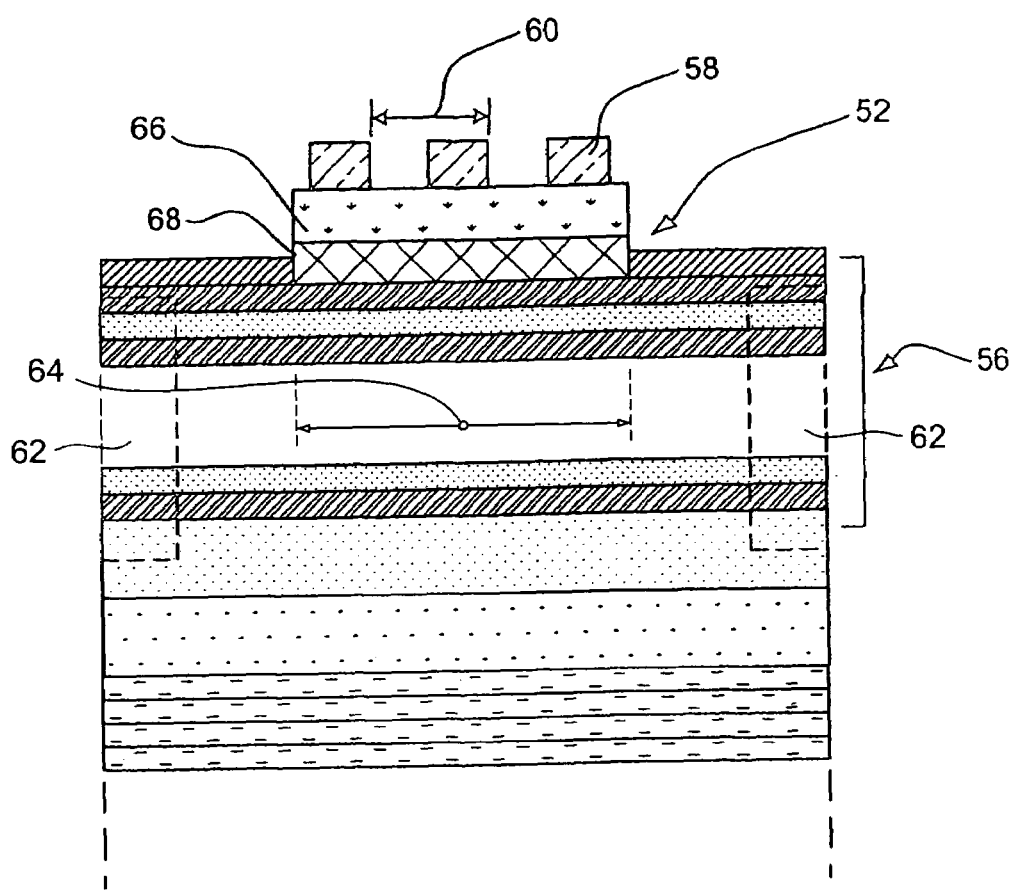
FIG. 2 is a schematic cross-sectional side view of a planar, current-guided, GaAs/AlGaAs top surface emitting vertical cavity laser with an illustrative resonant reflector.

As discussed in U.S. patent application Ser. No. 08/872,534, entitled "Resonant Reflector For Improved Optoelectronic Device Performance And Enhanced Applicability", a hybrid mirror structure may be used to reduce the overall mirror thickness. FIG. 2 is a schematic cross-sectional side view of a planar, current-guided, GaAs/AlGaAs top surface emitting vertical cavity laser with a hybrid top mirror including a resonant reflector 52 and a distributed Bragg reflector 56. This device combines the anomalous filtering properties of guided mode resonance in a dielectric waveguide grating with the reflective properties of a conventional DBR mirror.

The hybrid mirror structure includes, for example, a resonant reflector 52 and a DBR mirror 56. Although not explicitly shown, it is contemplated that the bottom mirror may also include a resonant reflector structure, if desired. It is known that a dielectric resonant reflector 52 is highly reflective on resonance, and may be more reflective than a corresponding DBR type mirror at the same wavelength. Thus, by using a hybrid approach, it is contemplated that the number of DBR mirror periods needed for a given reflectance may be reduced.

It is known that lateral straggle effects during ion implantation of the gain guiding region 62 through the DBR mirrors often limits the lateral dimension 64 of the active region to $\geq 10$ µm. This directly impacts the minimum achievable threshold current, single mode operation, and indirectly impacts the speed of the VCSEL. By incorporating a resonant reflector into the top mirror, equivalent or superior reflectance properties in a structure five to ten times thinner may be achieved. This may translate into an ion implant that is more controllable, which may reduce the volume of the active region. A smaller active region may reduce the operating current and power of the device, improve planarity and thus the monolithic integrability of the VCSEL with electronics and smart pixels, and may provide a controllable single mode and single polarization emission with increased modal control.

It is recognized that the hybrid approach of FIG. 2 is compatible with alternate existing gain-guiding techniques including etched pillars (with or without planarization and/or regrowth), lateral oxidation, selective growth, etc. By decreasing the overall thickness of the VCSEL mirrors, the resonant reflector may improve the processiblility and performance of the alternate current guiding approaches. While ion implantation is provided as an illustration, it is contemplated that any type of current and field confinement may be used, including for example, gain-guided, oxide-confinement, or any other means.

The resonant reflector 52 of FIG. 2 includes a three layer waveguide-grating structure suitable for use in a near IR VCSEL. The three-layer stack may be designed to function both as an anti-reflection (AR) coating near the emission wavelength for the VCSEL-structure substrate and independently as a guided-mode resonant reflector waveguide-grating. The three layers of resonant reflector 52 may form an anti-reflective region, which provides little reflectance for at least a predetermined range of wavelengths including a resonant wavelength. The grating multilayer waveguide structure shown at 52 causes the structure to become substantially more reflective, at least at the resonant wavelength.

Alternatively, the three-layer stack 52 may be designed to function both as a high-reflectivity coating for the VCSEL-structure substrate and independently as a guided-mode resonant reflector waveguide-grating. In this embodiment, the three-layer structure 52 forms a highly-reflective mirror region which provides reflectance for at least a predetermined range of wavelengths including a resonant wavelength (e.g., near 980 nm). The overall reflectance of the top mirror, including layers 66 and 68, may be less than that required for lasing. This may be accomplished by, for example, reducing the number of mirror periods in the top DBR mirror 56. Grating layer 58 causes the guided mode resonant reflector structure 52 to become substantially more reflective at least near the resonant wavelength. In either case, the number of DBR mirror layers beneath the resonant reflector 52 may be reduced relative to the conventional VCSEL construction shown in FIG. 1.

Resonance is achieved in the resonance reflector 52 by matching the first-diffraction order wave vector of the grating 58 to the propagating mode of the waveguide 66. Since the latter depends on polarization, the reflectance is inherently polarization-selective. The resonant wavelength is determined primarily by the grating period 60, and the bandwidth is determined primarily by the modulation of the refractive index and fill factor of the grating 58.

Figure 3:
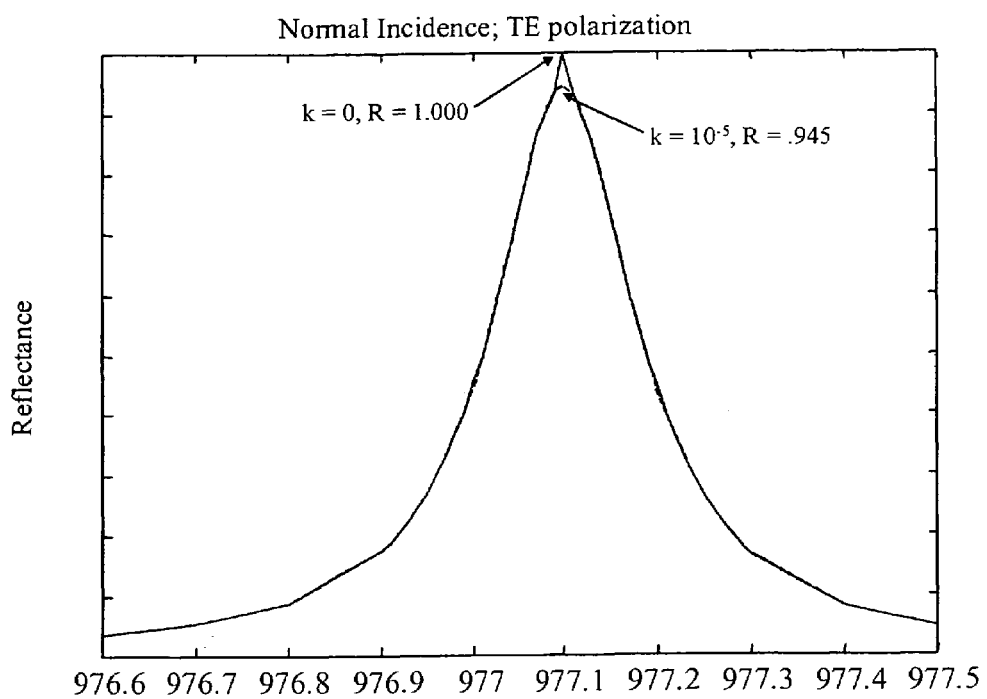
FIG. 3 is a graph showing the reflectivity versus wavelength of the resonant reflector of FIG. 2, both with a non-conductive (k=0) waveguide layer and a slightly conductive ($k=10^{-5}$) waveguide layer.

FIG. 3 is a graph showing reflectance curves for a resonant reflector assuming two values for the imaginary component of the refractive index ($k=0$ and $10^{-5}$) in any one layer of the waveguide-grating structure, and $k=0$ in the other two layers. In this example, the top layer, middle layer and bottom layer are formed from IndiumTinOxide (ITO), GaAs, and AlGaAs, respectively. The refraction indices for the top, middle and bottom layers are 1.96, 3.5 and 3.24, respectively, and the thicknesses of the top, middle and bottom layers are preferably $\lambda/4$, $3\lambda/4$ and $\lambda/4$, respectively. For this measurement, the layers are placed on a substrate with an effective reflective index of 3.2. This structure is simulated to exhibit one transverse Electric (TE) mode resonance (with a polarization parallel to the grating), no perpendicular resonance and a low out of resonant reflectance near $10^{-6}$.

The imaginary component "k" of the refractive index is related to optical absorption and electrical conductivity of the resonant reflector. The case $k=10^{-5}$, which roughly corresponds to the minimum conductivity required to inject current through the resonant reflector, produces about 5 percent absorption. The same three layers, all with $k=0$, indicating a dielectric resonant reflector, produces theoretically 100 percent reflectance.

This graph illustrates the extreme sensitivity of the resonant reflector 52 to absorption, or more generally, to loss of any kind. Thus, to maximize the reflectance provided by the resonant reflector, the absorption (e.g. $k=0$) for each of the layers 58, 66 and 68 should be near zero. This means that the conductivity of the resonant reflector should also be zero (e.g., non-conductive).

Figure 4:
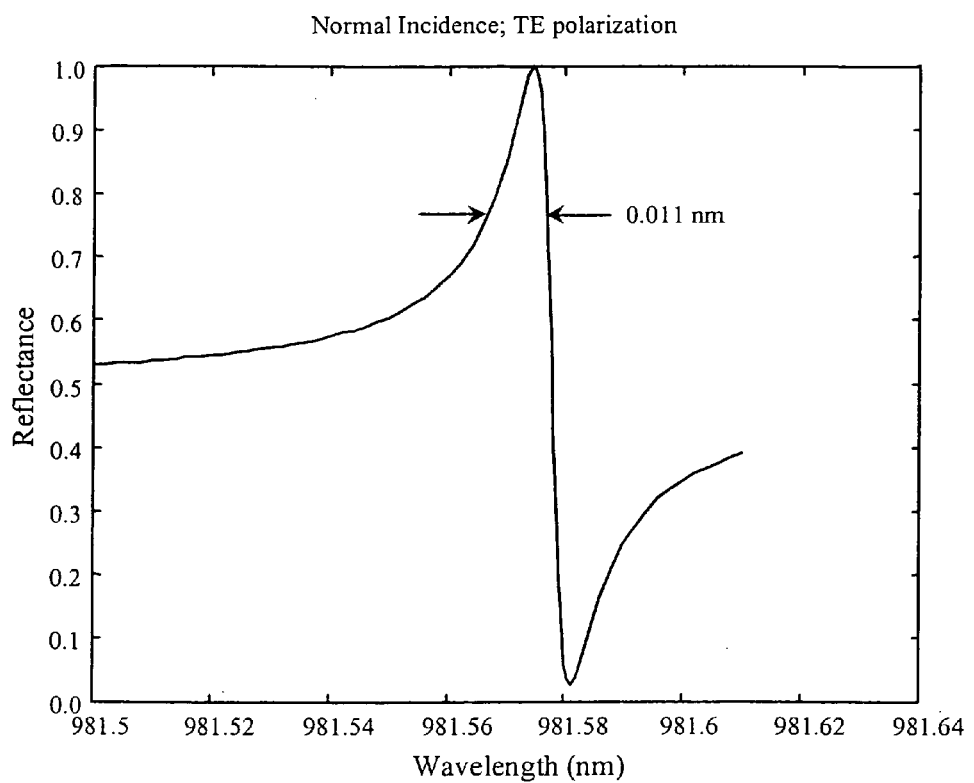
FIG. 4 is a graph showing the reflectance versus wavelength of an all non-conductive (k=0) resonant reflector placed adjacent a top mirror that is also non-conductive (k=0)
Figure 5:
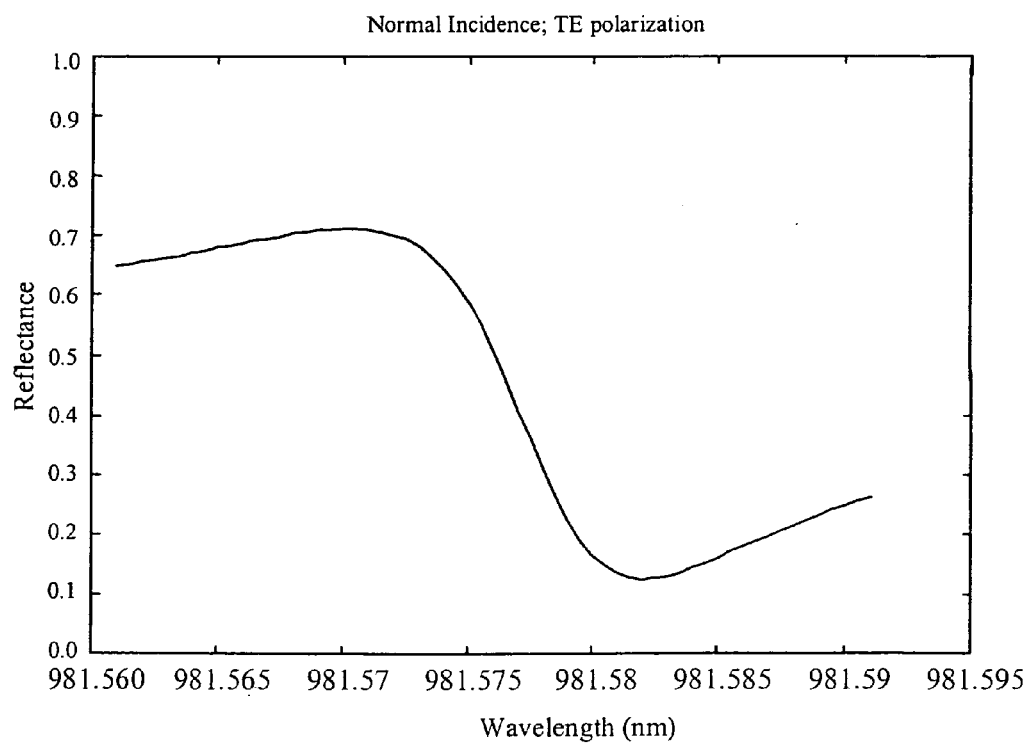
FIG. 5 shows the reflectance versus wavelength of an all non-conductive resonant reflector placed adjacent a top mirror that is slightly conductive ($k=10^{-5}$)

Despite the advantages of using a resonant reflector in conjunction with a DBR mirror stack, it has been found that the reflectivity of the resonant reflector can be limited if not properly isolated from the DBR mirror stack. FIG. 4 is a graph showing the reflectance versus wavelength of an all non-conductive ($k=0$) resonant reflector placed adjacent a top mirror that is also non-conductive ($k=0$). The reflectance curve has a narrow bandwidth, and reaches about 100% reflectivity at the resonant wavelength. In contrast, FIG. 5 shows the reflectance versus wavelength of an all non-conductive resonant reflector placed adjacent a top mirror that is slightly conductive ($k=10^{-5}$). As can be seen, having an adjacent top mirror that is slightly conductive significantly degrades the performance of the resonant reflector.

Too much energy in the guided-mode in the waveguide overlaps into the lossy, conductive DBR films of the optoelectronic device.

To overcome this and other difficulties, the present invention contemplates isolating the resonant reflector from adjacent conducting layers. Isolation is preferably accomplished by providing a non-conductive (e.g. dielectric) buffer or cladding layer between the resonant reflector and the adjacent conducting layer of the optoelectronic device. The non-conductive cladding or buffer layer is preferably sufficiently thick, and/or has a sufficiently low refractive index relative to the refractive index of the waveguide of the resonant reflector, to substantially prevent energy in the evanescent tail of the guided mode in the waveguide from entering the adjacent conducting layer of the optoelectronic device. In a preferred embodiment, the waveguide is formed from a dielectric that has a higher refractive index than the refractive index of the buffer or cladding layer, and also higher than the average refractive index of the grating. The thickness of the waveguide preferably depends on the refractive index difference between the waveguide and the buffer or cladding layer.

Figure 6:
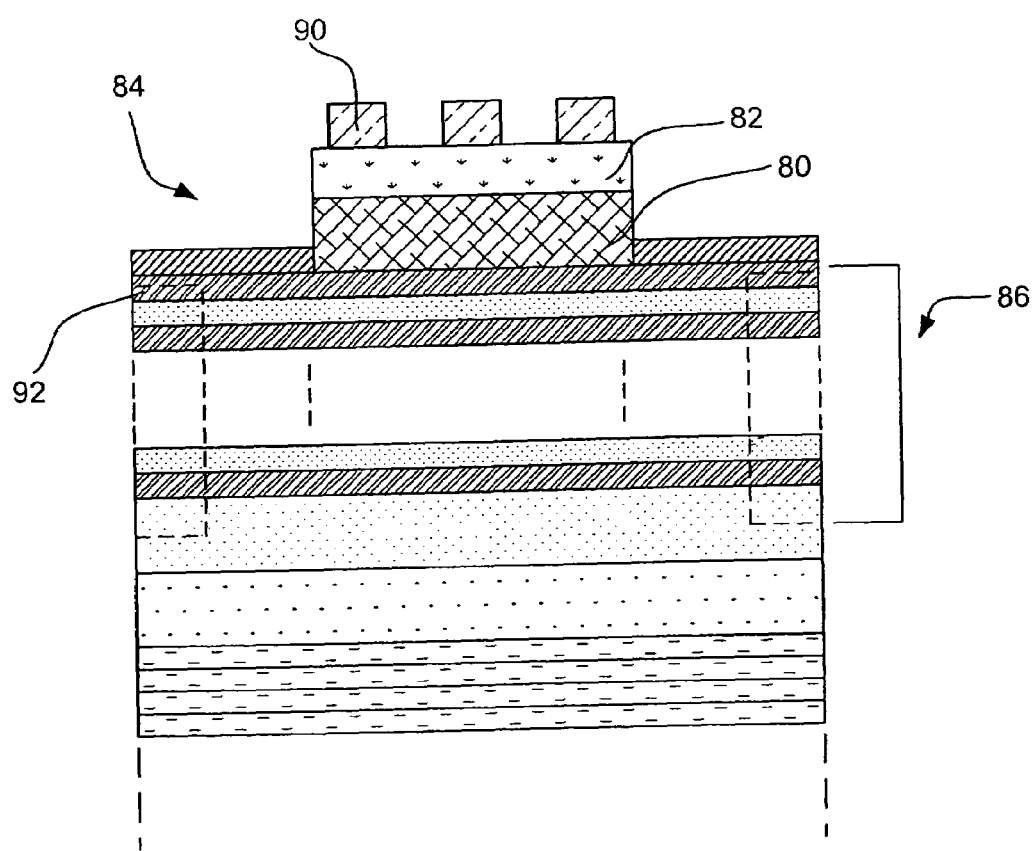
FIG. 6 is a schematic cross-sectional side view of a planar, current-guided, GaAs/AlGaAs top surface emitting vertical cavity laser with a cladding or buffer layer interposed between the waveguide layer of the resonant reflector and the top DBR mirror.

FIG. 6 is a schematic cross-sectional side view of a planar, current-guided, GaAs/AlGaAs top surface emitting vertical cavity laser with a cladding or buffer layer 80 interposed between the waveguide layer 82 of the resonant reflector 84 and the top DBR mirror 86. As indicated above, the cladding or buffer layer 80 is preferably sufficiently thick, and/or has a sufficiently low refractive index relative to the refractive index of the waveguide of the resonant reflector, to substantially prevent energy in the evanescent tail of the guided mode in the waveguide from entering an adjacent conductive layer of the optoelectronic device.

In the illustrative embodiment, the grating layer 90 is $SiO_2$ with an index of refraction of about 1.484 and a thickness of 0.340 μm. The waveguide layer 82 may be GaAs with an index of refraction of 3.523 and a thickness of 0.280 μm. Alternatively, the waveguide may be a ternary compound such as $Al_xGa_{1-x}As$, with x close to one, or a high refractive index dielectric such as $TiO2$, $ZrO2$, $HfO2$, or $Si3N4$. The thickness of the waveguide preferably depends on the refractive index difference between the waveguide and the buffer or cladding layer. The cladding or buffer layer 80 in the illustrative embodiment is AlO, with an index of refraction of 1.6 and a thickness of 0.766 μm. Finally, the top DBR mirror layer 92 may be AlGaAs with an index of refraction of 3.418 and a thickness of 0.072 μm. In this embodiment, the cladding or buffer layer 80 has an increased thickness and a reduced index of refraction relative to the embodiment shown in FIG. 2, both of which help prevent energy in the evanescent tail of the guided mode in the waveguide layer 82 from entering the top DBR mirror layer 92. It is contemplated however, that similar results may be achieved by either increasing the thickness or reducing the index of refraction of the cladding or buffer layer 80, if desired.

As indicated above, the cladding or buffer layer 80 may be AlO, which has a relatively low refractive index. In one method, this can be accomplished by initially forming the cladding or buffer layer 80 with AlGaAs, with a relatively high concentration of aluminum (e.g. >95%). AlGaAs has a relatively high index of refraction. Then, the waveguide layer 82 and grating layer 90 are provided. The cladding or buffer layer 80, waveguide layer 82 and grating 90 may then be removed around the periphery of the desired optical cavity. Contacts 93 may then be deposited on the exposed top mirror 86 to provide electrical contact to the top mirror. Then, the device may be subject to an oxidizing environment, which oxidizes the AlGaAs material of the cladding or buffer layer 80, resulting in AlO which has a relatively low refractive index. The AlGaAs material is preferably oxidized laterally in from the exposed edges of the cladding or buffer layer 80.

Figure 7:
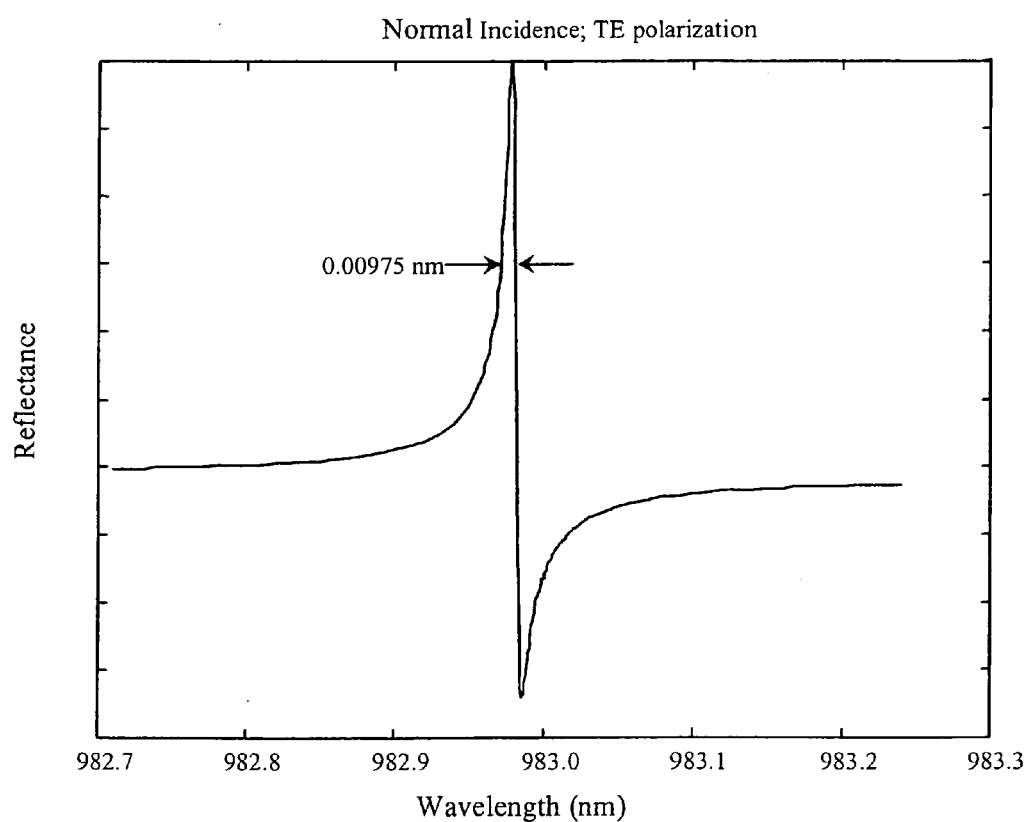
FIG. 7 is a graph showing the reflectance versus wavelength of the resonant reflector of FIG. 6 when the top layers of the top DBR mirror 86 are non-conductive (k=0)
Figure 8:
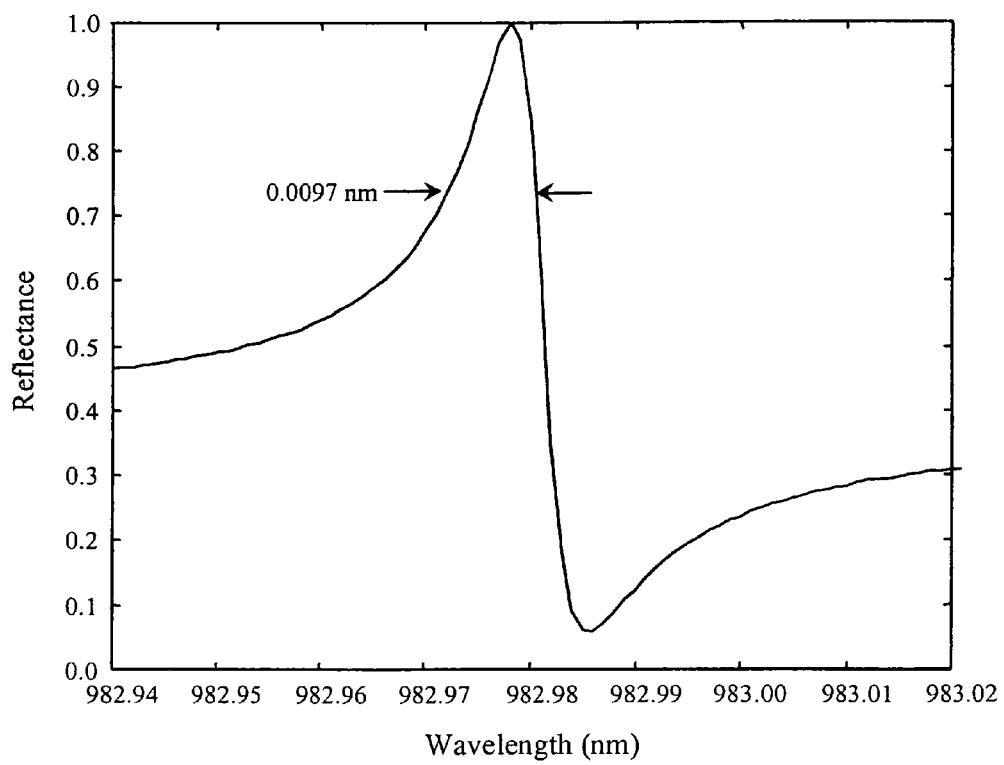
FIG. 8 is a graph showing the reflectance versus wavelength of the resonant reflector of FIG. 6 when the top layers of the top DBR mirror 86 are slightly conductive ($k=10^{-5}$)

FIG. 7 is a graph showing the reflectance versus wavelength of the resonant reflector of FIG. 6 when the top layers of the top DBR mirror 86 are non-conductive (k=0). The reflectance curve has a narrow bandwidth (0.00975 nm), and theoretically reaches 100% reflectivity at the resonant wavelength. FIG. 8 is a graph showing the reflectance versus wavelength of the resonant reflector of FIG. 6 when the top layers of the top DBR mirror 86 are slightly conductive ($k=10^{-5}$). As can be seen, the reflectance curve still has a narrow bandwidth (0.0097 nm), and theoretically reaches 100% reflectivity at the resonant wavelength. Therefore, and unlike FIG. 5, there is little or no degradation in the observed reflectance of the resonant reflector, even when placed adjacent a conductive layer.

Figure 9:
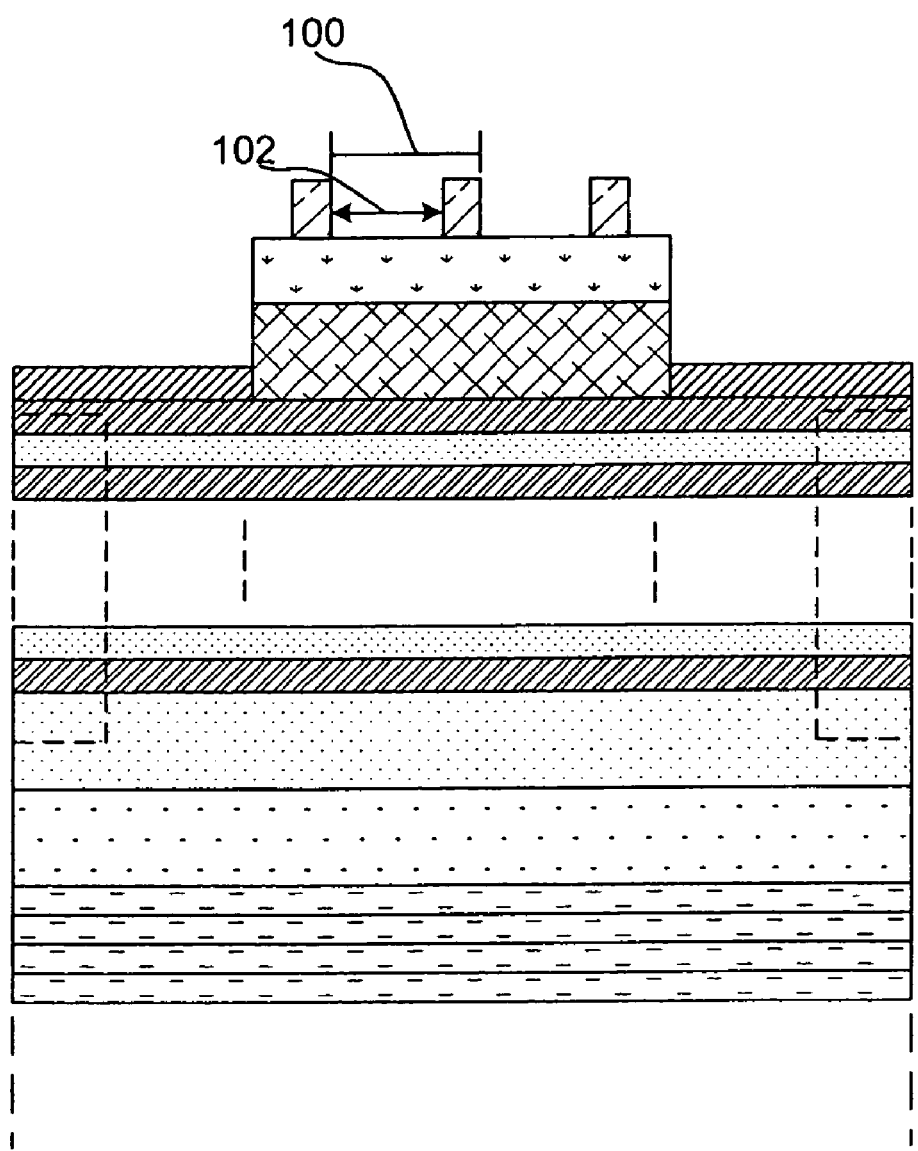
FIG. 9 is a schematic cross-sectional side view of a top surface emitting vertical cavity laser similar to that shown in FIG. 6, but with a modified grating fill factor.

FIG. 9 is a schematic cross-sectional side view of a top surface emitting vertical cavity laser similar to that shown in FIG. 6, but with a modified grating fill factor. The grating fill factor is defined as the grating spacing 102 divided by the grating period 100. The resonant wavelength of a resonant reflector is often determined by the grating period 100, and the spectral bandwidth is often determined by the modulation of the refractive index and fill factor of the grating.

When the grating is formed from an oxide such as $SiO_2$, the modulation of the refractive index is related to the difference between the dielectric constants of the grating material and the material that fills the spaces between the grating elements, divided by the average dielectric constant across the grating. The average dielectric constant across the grating can be changed by varying the fill factor of the grating. For example, and assuming a constant grating period, the grating fill factor can be increased by reducing the width of each grating element. A limitation of achieving a desired spectral bandwidth of a resonant reflector by altering the grating fill factor is that the design rules of many manufacturing processes limit the minimum width of the grating elements. Thus, to achieve some spectral bandwidths, the design rules may have to be pushed, which may reduce the manufacturing yield for the devices.

Figure 10:
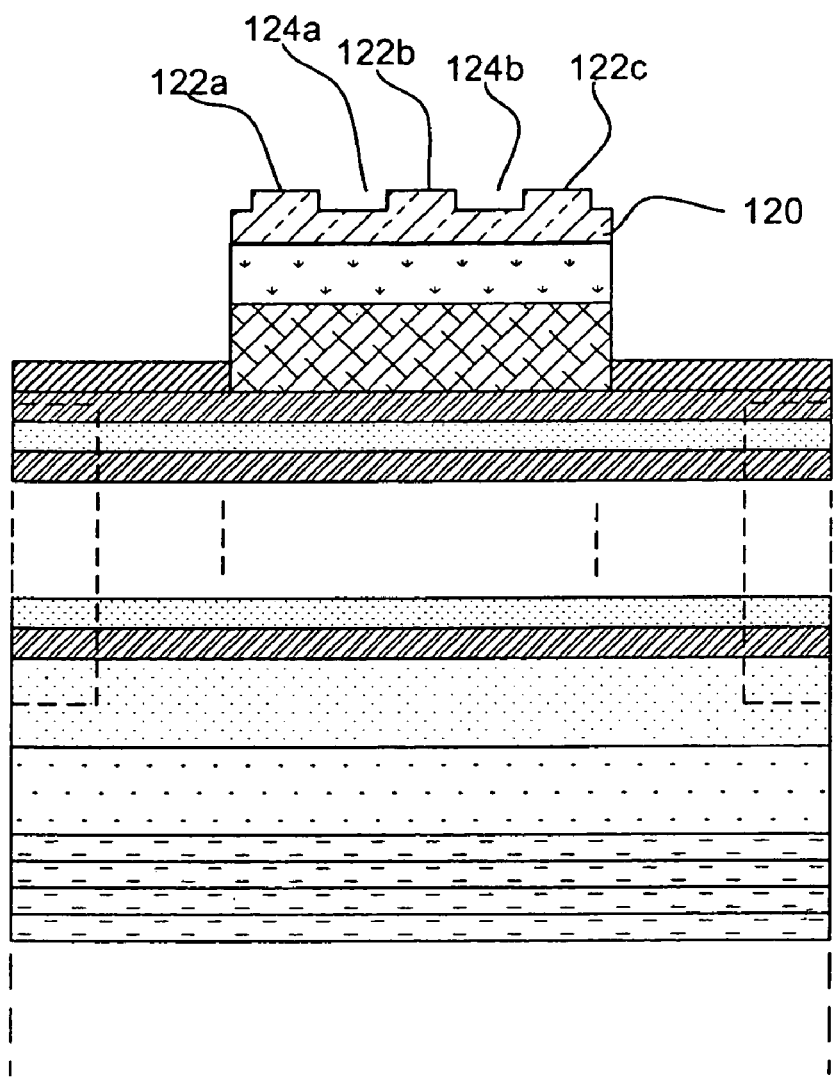
FIG. 10 is a schematic cross-sectional side view of a top surface emitting vertical cavity laser similar to that shown in FIG. 6, but with a grating film that has a controlled etch depth.

FIG. 10 is a schematic cross-sectional side view of a top surface emitting vertical cavity laser similar to that shown in FIG. 6, but with a grating film that has a controlled etch depth to control the spectral bandwidth of the resonant reflector. Like above, a grating film 120 is provided and subsequently etched to form two or more spaced grating regions 122a-122c separated by one or more spaced etched regions 124a-124b. However, rather than etching all the way through the grating film 120 to achieve a desired grating fill factor, and thus a desired spectral bandwidth, the depth of the etch is controlled. By controlling the depth of the etch, a desired average dielectric constant across the grating can be achieved. A benefit of this approach is that the grating width and grating spacing may be optimized to the design rules of the manufacturing process, and the etch depth can be controlled to achieve the desired spectral bandwidth. For example, a fill factor of about 50% is preferred. This may increase the producibility and yield of the resonant reflector.

Figure 11:
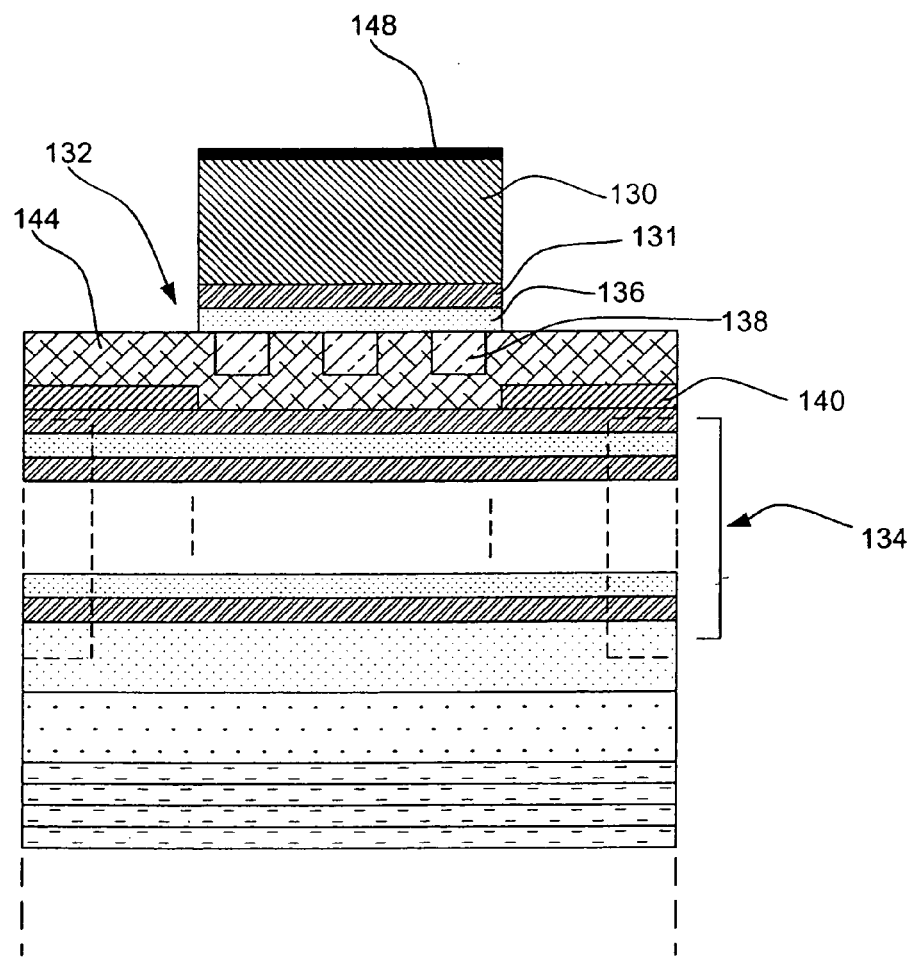
FIG. 11 is a schematic cross-sectional side view of a vertical cavity surface emitting laser that is formed by bonding a resonant reflector that was prepared on a first substrate to the top mirror of the vertical cavity surface emitting laser that was prepared on a second substrate.

FIG. 11 is a schematic cross-sectional side view of a vertical cavity surface emitting laser that is formed by bonding a resonant reflector 132 that is prepared on a first substrate 130 to a top mirror 134 of a vertical cavity surface emitting laser that is prepared on a second substrate. In accordance with this embodiment, a resonant reflector is formed on a front side 131 of a first substrate 130. This includes forming at least a waveguide 136 and a grating 138, as shown. Then, at least a portion of an optoelectronic device, such as a vertical cavity surface emitting laser or resonant cavity photodetector, is prepared on a front side of a second substrate. In FIG. 11, this includes a bottom DBR mirror, an active region, a top DBR mirror 134, and one or more contacts 140.

Thereafter, the front side of the first substrate 130 is bonded to the front side of the second substrate to complete the optoelectronic device. The first substrate 130 may be bonded to the second substrate using an optical epoxy 144, and preferably a non-conductive optical epoxy. The optical epoxy is preferably sufficiently thick, or has a sufficiently low refractive index relative to the refractive index of the waveguide 136 of the resonant reflector 132, so that the energy from the evanescent wave vector in the waveguide 136 is substantially prevented from entering the optoelectronic device on the first substrate. A anti-reflective coating 148 may be applied to the backside of the first substrate 130 as shown.

It is recognized that the relative position of the waveguide 136 and grating 138 may be changed. For example, and as shown in FIG. 11, the grating may be positioned more toward the front side of the first substrate than the waveguide. Alternatively, however, the waveguide may be positioned more toward the front side of the first substrate than the grating, if desired.

Figure 12:
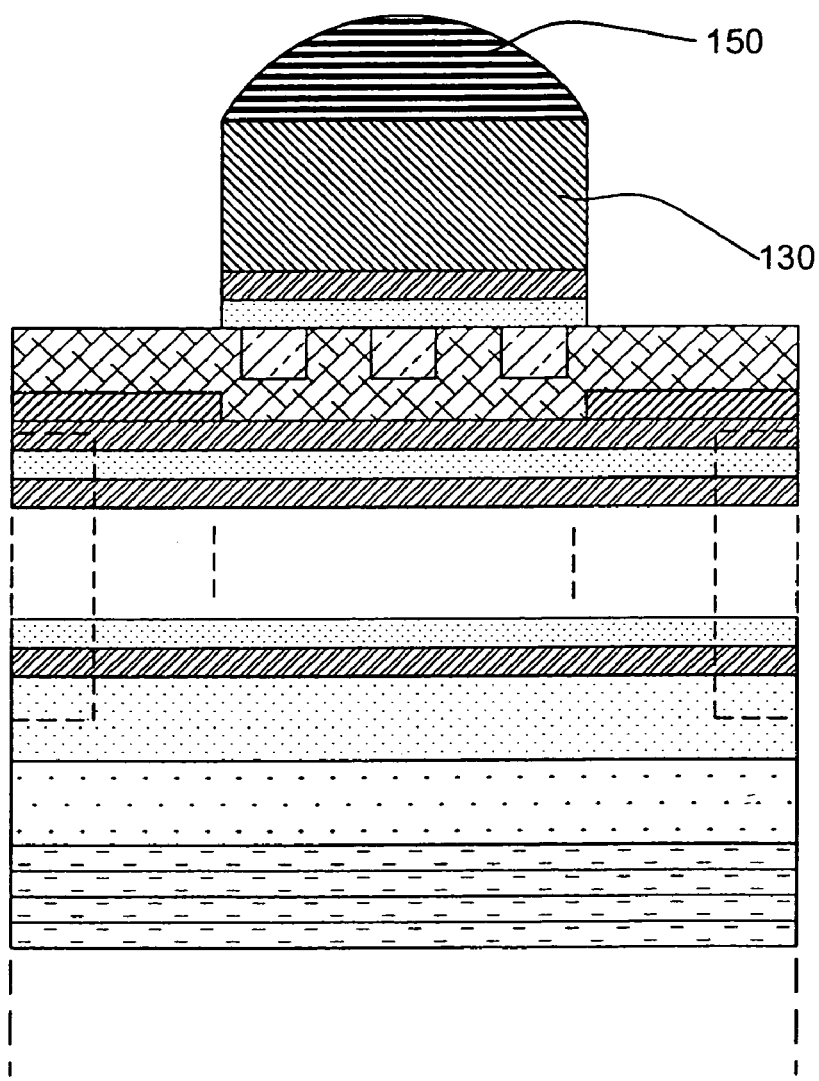
FIG. 12 is a schematic cross-sectional side view of the vertical cavity surface emitting laser of FIG. 11 with a microlens positioned on the backside of the substrate that has the resonant reflector formed thereon.

FIG. 12 is a schematic cross-sectional side view of the vertical cavity surface-emitting laser of FIG. 11 with a microlens 150 positioned on the backside of the first substrate 130. For top emitting devices, a microlens such as a collimating microlens may be formed on the backside of the first substrate 130. For back emitting devices, a collimating microlens may be formed on the backside of the substrate that carries the bottom mirror, the active region and the top mirror of the optoelectronic device. In either case, the collimating microlens 150 is preferably placed in registration with the output of the optoelectronic device as shown.

Figure 13:
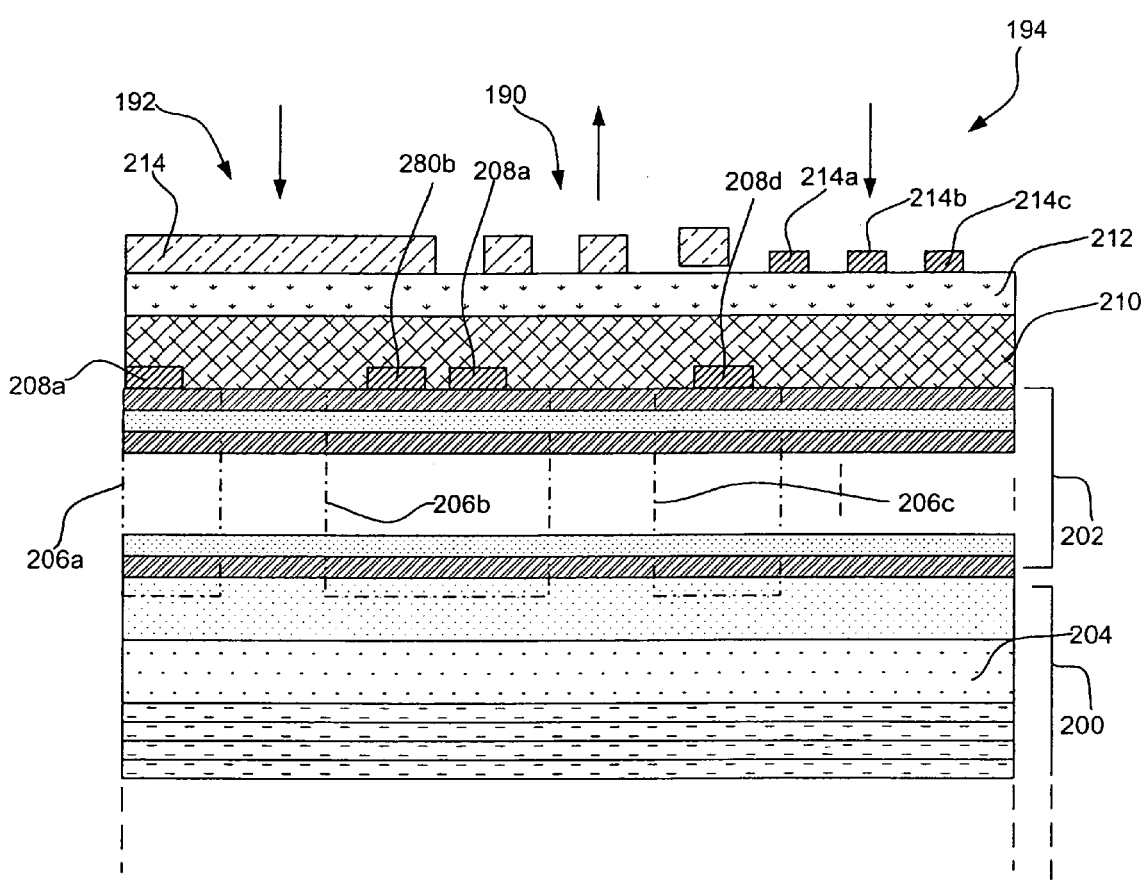
FIG. 13 is a schematic cross-sectional side view of an illustrative monolithic substrate having a RCPD, a VCSEL and a MSM.

It is contemplated that a number of optoelectronic devices may be formed on a common substrate, as shown in FIG. 13. One application for such a configuration is a monolithic transceiver that includes one or more light emitting devices 190 and one or more light receiving devices 192 and 194. In this illustrative embodiment, both the light emitting and light receiving devices are formed on a common substrate (not shown). In one example, a bottom mirror is first formed on the common substrate. The bottom mirror may serve as the bottom mirror for more than one of the optoelectronic devices 190, 192 and 194, and is preferably a DBR mirror stack that is doped to be at least partially conductive. An active region 200 is then formed on the bottom mirror, followed by a top mirror 202. Like the bottom mirror, the top mirror 202 is preferably a DBR mirror stack, and is doped to be the opposite conductivity type of the bottom mirror. The active region 200 may include cladding layers 204 on either side of the active region 200 to help focus the light energy and current in the active region.

A deep H+ ion implant, as shown at 206a-206c, may provide gain guide apertures for selected optoelectronic devices, and may further electrically isolate adjacent devices from one another. While a deep H+ implant is provided as an illustration, it is contemplated that any type of current and field confinement may be used, including for example, gain-guided, oxide-confinement, or any other means. Contacts 208a-208d may be provided on the top mirror 202 and on the bottom surface of the common substrate to provide electrical contact to each of the optoelectronic devices.

Next, a cladding or buffer layer 210 may be provided above the top mirror 202. A resonant reflector may then be provided on top of the cladding or buffer layer 210. The resonant reflector may include a waveguide 212 and a grating film 214. For some optoelectronic devices, such as top emitting devices 190, the grating film 214 may be etched to form a grating, as shown. The grating may substantially increase the reflectivity of the resonant reflector in those regions. For other optoelectronic devices, such as top receiving devices 192, the grating film may either include a different grating structure (e.g., wider spectral bandwidth), or remain non-etched as shown. This may reduce the reflectivity of the resonant reflector, thereby allowing light to more easily enter the optical cavity. For yet other optoelectronic devices, such as Metal-Semiconductor-Metal (MSM) receiving devices 194, the grating film may be removed altogether, and a metal grid 214a-214c may be formed on the waveguide layer 212 or cladding or buffer layer 210, as desired.

To isolate the resonant reflector from the optoelectronic devices, and in particular the conductive top mirror 202, the cladding or buffer layer 210 may be sufficiently thick to substantially prevent energy in the evanescent tail of the guided mode in the waveguide 212 from entering the top mirror 202. Alternatively, or in addition, the cladding or buffer layer 210 may be formed from a material that has a sufficiently low refractive index relative to the refractive index of the waveguide 212 to substantially prevent energy in the evanescent tail of the guided mode in the waveguide 212 from entering the top mirror 202.

Implementation of the described resonant reflector optoelectronic structures will permit polarization, emission wavelength and mode control. These structures and properties can be designed and fabricated using techniques such as lithography or holography, and may not be subject to growth thickness variations alone. The above techniques can be applied to produce, for example, VCSELs with high power single-mode/polarization emission from apertures exceeding a few microns in diameter. Furthermore, wavelength and/or polarization variation across a chip, array or wafer can be used for spatially varied wavelength/polarization division multiplexing, multi-wavelength spectroscopy, etc.

Having thus described the preferred embodiments of the present invention, those of skill in the art will readily appreciate that the teachings found herein may be applied to yet other embodiments within the scope of the claims hereto attached.

What is claimed is:

1. A method for forming an optoelectronic device, comprising:
   forming a substrate;
   forming a bottom mirror on the substrate, the bottom mirror being at least partially conductive;
   forming an active region above the bottom mirror;
   forming a top mirror above the active region, the top mirror being at least partially conductive;
   defining a gain guide aperture in the top mirror; and
   forming, above the top mirror, a substantially dielectric isolation layer, and a resonant reflector, the substantially dielectric isolation layer being interposed between the resonant reflector and the top mirror, and the substantially dielectric isolation layer being formed so as to substantially prevent energy in an evanescent tail of a guided mode associated with the resonant reflector from entering the top mirror.

2. The method as recited in claim 1, wherein the top mirror and bottom mirror are Distributed Bragg Reflector mirrors.

3. The method as recited in claim 2, wherein the Distributed Bragg Reflector mirrors include alternating layers of AlGaAs and AlAs.

4. The method as recited in claim 1, wherein a top layer of the top mirror substantially comprises AlGaAs.

5. The method as recited in claim 1, wherein the ability of the substantially dielectric isolation layer to substantially prevent energy in the evanescent tail of the guided mode associated with the resonant reflector from entering the top mirror results from at least one of: the substantially dielectric isolation layer being formed of a material having a refractive index that is sufficiently low, relative to a refractive index associated with the resonant reflector; and, the substantially dielectric isolation layer being sufficiently thick.

6. The method as recited in claim 1, wherein the substantially dielectric isolation layer comprises one of: a cladding layer; or, a buffer layer.

7. The method as recited in claim 1, wherein the substantially dielectric isolation layer initially substantially comprises AlGaAs, which is subsequently oxidized to AlO.

8. The method as recited in claim 7, wherein the substantially dielectric isolation layer is substantially laterally oxidized.

9. The method as recited in claim 1, wherein defining the gain guide aperture in the top mirror comprises one of: implementing an H+ ion implant in the top mirror; implementing gain-guided current and field confinement in the top mirror; and, implementing oxide-confinement in the top mirror.

10. The method as recited in claim 1, wherein the substrate comprises a VCSEL-structure substrate, and the resonant reflector is formed so as to be one of: substantially reflective for the VCSEL-structure substrate; or, substantially non-reflective near an emission wavelength for the VCSEL-structure substrate.

11. The method as recited in claim 1, wherein forming the resonant reflector comprises:

providing a waveguide;

providing a grating film adjacent the waveguide; and etching the grating film to form at least two spaced grating regions separated by at least one spaced etched region, the at least one spaced etched region extending to a depth that produces a desired optical property for the resonant reflector but not extending all the way through the grating film.

12. The method as recited in claim 11, wherein the waveguide substantially comprises GaAs.

13. The method as recited in claim 11, wherein the grating is formed by etching an $SiO_2$ film.

14. The method as recited in claim 11, wherein the waveguide and grating are formed such that a first-diffraction order wave vector of the grating substantially matches a propagating mode of the waveguide.

15. The method as recited in claim 11, wherein a refractive index of the waveguide is higher than an average refractive index of the grating.

16. The method as recited in claim 11, wherein the waveguide includes a first dielectric and the substantially dielectric isolation layer includes a second dielectric layer having a refractive index that is less than a refractive index of the first dielectric.

* * * * *

UNITED STATES PATENT AND TRADEMARK OFFICE
CERTIFICATE OF CORRECTION

PATENT NO. : 7,288,421 B2
APPLICATION NO. : 10/884895
DATED : October 30, 2007
INVENTOR(S) : Cox et al.

It is certified that error appears in the above-identified patent and that said Letters Patent is hereby corrected as shown below:

Page 2, Other Publications Left Hand Side
Line 63, change "CLOE" to --CLEO--

Page 2, Other Publications Right Hand Side
Line 33, change "Macy" to --May--
Line 63, change "Jwell" to --Jewell--
Line 63, change "Surface-Emitting" to --"Surface-Emitting--
Line 64, change "Interchip Connections" to --Interchip Connections"--

Signed and Sealed this

Twenty-fourth Day of August, 2010

David J. Kappos
*Director of the United States Patent and Trademark Office*